United States Patent
Tanaka et al.

(10) Patent No.: US 10,041,663 B2
(45) Date of Patent: Aug. 7, 2018

(54) LIGHT SOURCE AND METHOD OF MOUNTING LIGHT-EMITTING DEVICE

(71) Applicant: TOYOTA GOSEI CO., LTD., Kiyosu-shi (JP)

(72) Inventors: Motoyuki Tanaka, Kiyosu (JP); Yosuke Tsuchiya, Kiyosu (JP); Aya Kawaoka, Kiyosu (JP); Makoto Ishida, Kiyosu (JP); Yuhki Ito, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/683,392

(22) Filed: Aug. 22, 2017

(65) Prior Publication Data

US 2018/0080641 A1  Mar. 22, 2018

(30) Foreign Application Priority Data

Sep. 21, 2016 (JP) ................................. 2016-184666

(51) Int. Cl.
| | |
|---|---|
| F21V 21/00 | (2006.01) |
| F21V 23/06 | (2006.01) |
| F21V 9/16 | (2006.01) |
| F21V 17/10 | (2006.01) |
| F21V 9/30 | (2018.01) |

(52) U.S. Cl.
CPC ................ *F21V 23/06* (2013.01); *F21V 9/16* (2013.01); *F21V 9/30* (2018.02); *F21V 17/101* (2013.01)

(58) Field of Classification Search
CPC .............................. F21V 23/06; F21V 17/101

USPC .......................... 362/217.01, 217.14, 217.17
See application file for complete search history.

(56) References Cited

U.S. PATENT DOCUMENTS

| | | | | |
|---|---|---|---|---|
| 6,833,566 B2 * | 12/2004 | Suehiro | .................. | F21S 43/14 257/99 |
| 7,161,187 B2 * | 1/2007 | Suehiro | ................. | F21V 29/004 257/98 |

(Continued)

FOREIGN PATENT DOCUMENTS

| | | |
|---|---|---|
| JP | H 10-223817 A | 8/1998 |
| JP | 2002-289923 A | 10/2002 |

(Continued)

*Primary Examiner* — Paultep Savusdiphol
(74) *Attorney, Agent, or Firm* — McGinn IP Law Group, PLLC

(57) ABSTRACT

A light source includes: a mounting substrate; and a side-view type light-emitting device including: a substrate; through holes; a front electrode; a rear electrode; side electrodes; and a light-emitting element, wherein: land patterns are formed on a front surface of the mounting substrate, in positions corresponding to the through holes, each land pattern having an inverted "T" shape composed of a narrow region and a wide region; the light-emitting device is arranged such that the cross sectional shape of the through hole in the long side direction of the substrate is aligned with the shape of the narrow region of the land pattern, in a plan view; and solder members are formed in a wall shape on the mounting substrate, are formed in the through holes on the mounting substrate, and connects the rear electrode and the side electrode to the wide region and the narrow region, respectively.

6 Claims, 3 Drawing Sheets

(56) References Cited

U.S. PATENT DOCUMENTS

| | | | |
|---|---|---|---|
| 7,479,665 B2* | 1/2009 | Takine | H01L 25/167 257/99 |
| 9,406,852 B2* | 8/2016 | Nakabayashi | H01L 33/486 |
| 2002/0139990 A1* | 10/2002 | Suehiro | F21S 43/14 257/99 |
| 2005/0082561 A1* | 4/2005 | Suehiro | F21V 29/004 257/99 |
| 2006/0186427 A1* | 8/2006 | Takine | H01L 25/167 257/99 |
| 2016/0336494 A1* | 11/2016 | Nakabayashi | H01L 33/486 |

FOREIGN PATENT DOCUMENTS

| | | |
|---|---|---|
| JP | 2006-229007 A | 8/2006 |
| JP | 2013-110210 A | 6/2013 |
| JP | 2015-079579 A | 4/2015 |
| JP | 2016-001724 A | 1/2016 |

\* cited by examiner

LIGHT SOURCE AND METHOD OF MOUNTING LIGHT-EMITTING DEVICE

CROSS-REFERENCE TO RELATED APPLICATION(S)

This application is based upon and claims the benefit of priority from Japanese Patent Application No. 2016-184666, filed on Sep. 21, 2016, the entire contents of which are incorporated herein by reference.

BACKGROUND

1. Field of the Invention

The present invention relates to a method of mounting a side-view type light-emitting device. In addition, the present invention relates to a light source in which a side-view type light-emitting device is mounted on a mounting substrate thereof.

2. Description of the Related Art

As a backlight light source of a liquid crystal display, a linear light source, in which a plurality of side-view type light-emitting devices horizontally emitting light with respect to a mounting surface are mounted on a mounting substrate, has been used.

JP-A-2006-229007 discloses a light source in which a side-view type light-emitting device is mounted on a mounting substrate. Solder that connects a rear electrode of the light-emitting device and the mounting substrate flows around to a rear surface of the light-emitting device. The light-emitting device has a circular through hole that is formed to pass through a substrate, and a front electrode on a front surface of the substrate and the rear electrode on the rear surface of the substrate are connected to each other via the through hole.

JP-A-2013-110210 discloses an optical device in which a side-view type light-emitting device having a through hole, in which a long side thereof is cut in a semicircular shape, is mounted on a mounting substrate. Due to the through hole having this shape, when the light-emitting device is mounted on the mounting substrate, it is possible to prevent the light-emitting device from being mounted in an inclined state on the mounting substrate.

However, in the case in which solder is applied only onto the rear surface as disclosed in JP-A-2006-229007, there is a problem that a light-emitting element is inclined due to contraction of the solder when the molten solder is cured, and thus a Manhattan phenomenon occurs in which the light-emitting surface is floating.

Meanwhile, as disclosed in JP-A-2013-110210, in the case in which the side-view type light-emitting device having the through hole, formed by cutting the long side of the substrate, is mounted on the mounting substrate, since an area of a mounting land is insufficient, it is difficult to secure sufficient mounting strength.

SUMMARY

An object of the present invention is to improve mounting strength and prevents a Manhattan phenomenon when a light-emitting device having a through hole formed by cutting a long side of a substrate is mounted on a mounting substrate.

According to an aspect of the present invention, there is provided a light source including: a mounting substrate; and a side-view type light-emitting device, mounted on the mounting substrate, the light-emitting device including: a substrate having an oblong shape; through holes provided at both ends of the substrate and formed to pass through the substrate; a front electrode provided on a front surface of the substrate; a rear electrode provided on a rear surface of the substrate; side electrodes provided on side surfaces of the through holes and connecting the front electrode and the rear electrode to each other; and an oblong flip chip type light-emitting element provided on the front surface of the substrate and connected to the front electrode, wherein: the through holes are formed by cutting a long side of the substrate; land patterns are formed on a front surface of the mounting substrate, in positions corresponding to the through holes, each land pattern having an inverted "T" shape composed of a narrow region and a wide region having a wider width than the narrow region, the narrow region having a shape identical to a cross sectional shape of the through hole in a long side direction of the substrate; the light-emitting device is arranged such that the cross sectional shape of the through hole in the long side direction of the substrate is aligned with the shape of the narrow region of the land pattern, in a plan view; and solder members are formed in a wall shape on the mounting substrate, are formed in the through holes on the mounting substrate, and connects the rear electrode and the side electrode to the wide region and the narrow region, respectively.

In the light source of the present invention, a width of the wide region in a long side direction of the substrate may be larger than a width of the narrow region in the long side direction of the substrate by 30% or more. Therefore, the mounting strength of the light-emitting device can be improved. In addition, for the same purpose, in the light source of the present invention, a width of the wide region in a short side direction of the substrate is larger than a width of the narrow region in the short side direction of the substrate by 50% or more.

In the light source of the present invention, the rear electrode may have a rectangular pattern connected to the side electrode and an oblong pattern extending from the rectangular pattern in the long side direction of the substrate and has a constricted portion in a connection portion by which the rectangular pattern and the oblong pattern are connected to each other, the constricted portion being arranged near the through hole. Due to the oblong pattern, heat dissipation property can be improved. In addition, the constricted portion can prevent the solder from flowing in a longitudinal direction and facilitate formation of a wall-like solder member on the rear surface of the light-emitting device, thereby improving the mounting strength.

In the light source of the present invention, a plurality of the light-emitting devices may be arranged at intervals on the mounting substrate, and an interval between the light-emitting elements in one light-emitting device of the light-emitting devices may be set to be equal to an interval between the light-emitting elements in the respective light-emitting devices adjacent to each other.

According to another aspect of the present invention, there is provided a method of mounting a side-view type light-emitting device on a mounting substrate, the light-emitting device including: a substrate having an oblong shape; through holes provided at both ends of the substrate and formed to pass through the substrate; a front electrode provided on a front surface of the substrate; a rear electrode provided on a rear surface of the substrate; side electrodes provided on side surfaces of the through holes and connecting the front electrode and the rear electrode to each other; and an oblong flip chip type light-emitting element provided on the front surface of the substrate and connected to the front electrode, in which the through holes being formed by cutting long sides of the substrate, the method including: forming a land pattern on a front surface of the mounting substrate, in a position corresponding to the through hole, the land pattern having an inverted "T" shape composed of a narrow region and a wide region having a wider width than the narrow region, the narrow region having a shape identical to a cross sectional shape of the through hole in a long side direction of the substrate; forming a solder member on the land pattern; arranging the light-emitting device such that the cross sectional shape of the through hole in the long side direction of the substrate is aligned with the shape of the narrow region of the land pattern, in a plan view; and melting the solder member through heat treatment such that the solder member is formed in a wall shape on the mounting substrate and is formed in the through hole on the mounting substrate, thereby connecting the rear electrode and the side electrode to the wide region and the narrow region, respectively.

According to the invention, the solder member can be formed in a wall shape on the rear surface of the light-emitting device. Therefore, it is possible to improve mounting strength of the side-view type light-emitting device.

BRIEF DESCRIPTION OF THE DRAWINGS

The present invention will become more fully understood from the detailed description given hereinbelow and the accompanying drawing which is given by way of illustration only, and thus is not limitative of the present invention and wherein.

DETAILED DESCRIPTION OF THE INVENTION

Hereinafter, preferred embodiments of the present invention will be described with reference to the drawings, but the present invention is not limited to the embodiments.

Figure 1:
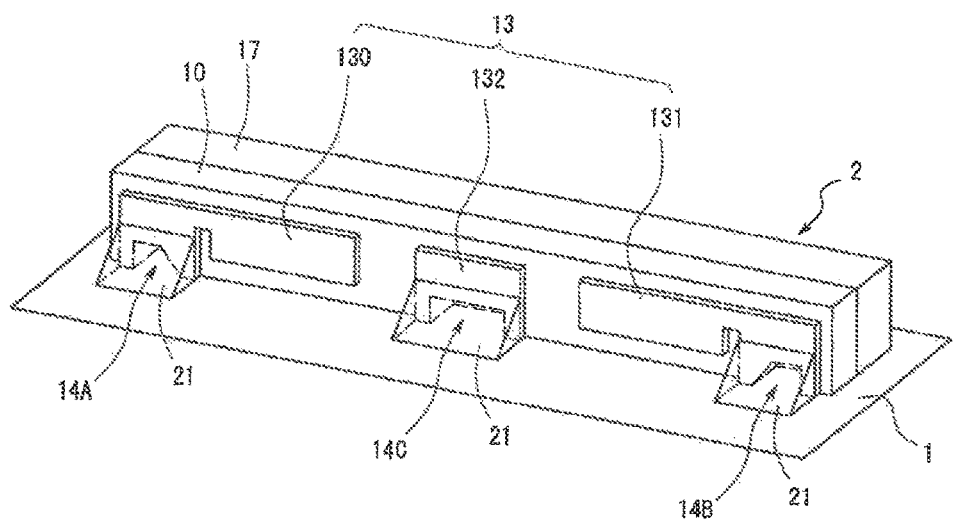
FIG. 1 is a view illustrating a configuration of a light source according to an embodiment.

FIG. 1 is a view illustrating a configuration of a light source according to an embodiment. The light source according to the embodiment is structured such that a side-view type light-emitting device 2 is mounted on a mounting substrate 1. FIG. 1 is the view illustrating the light source viewed from the rear surface of the light-emitting device 2 according to the embodiment.

(Configuration of Light-Emitting Device 2)

Figure 2:
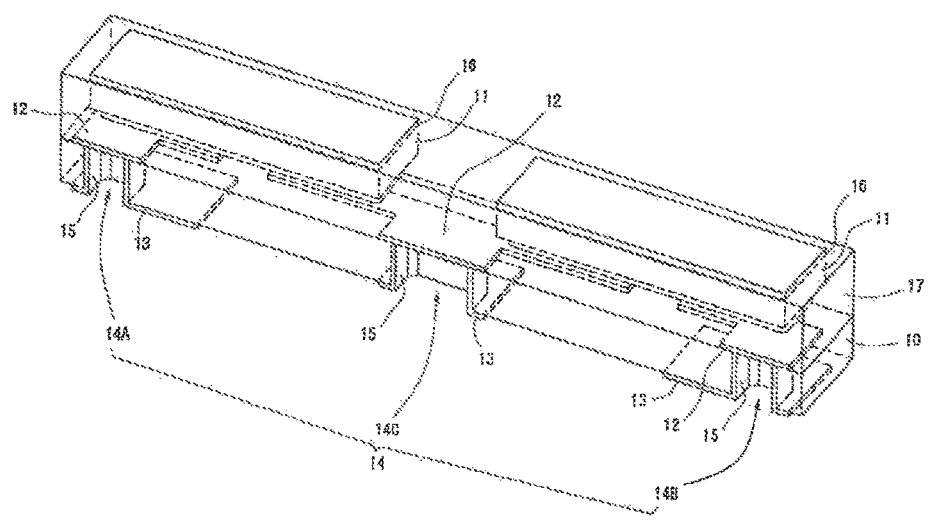
FIG. 2 is a view illustrating a light-emitting device 2 as viewed from an obliquely upper side.
Figure 3:
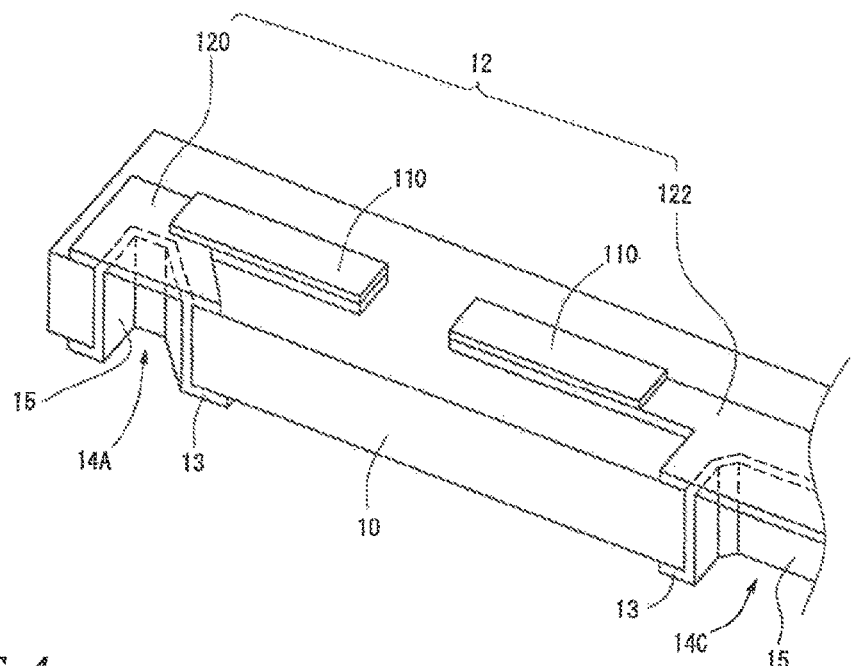
FIG. 3 is a view illustrating a positional relationship between an electrode 110 of a light-emitting element 11 and a front electrode 12.
Figure 4:
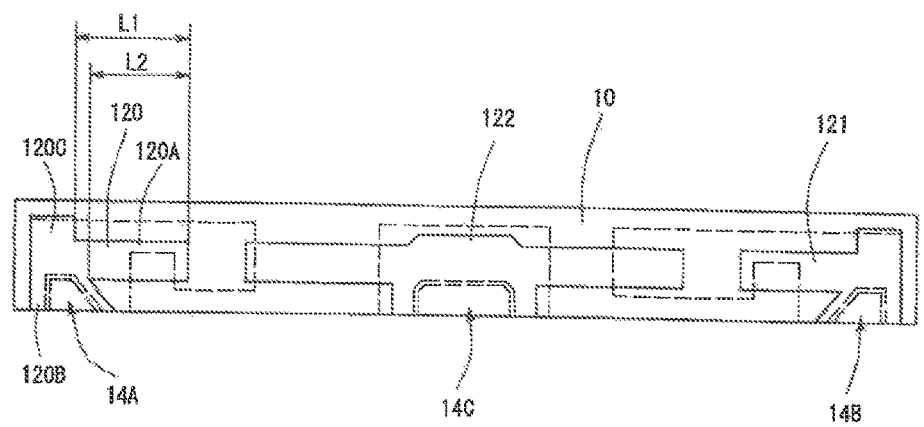
FIG. 4 is a view illustrating a pattern of the front electrode 12 and a through hole 14.

Next, the construction of the light-emitting device 2 will be described. FIG. 2 is a view illustrating the construction of the light-emitting device 2. The light-emitting device 2 emits white light, and is of a side-view type which horizontally emits light with respect to a mounting surface. FIG. 2 is a view of the light-emitting device 2 arranged in a state in which light is emitted upward as viewed from an obliquely upper side. FIG. 3 is a view illustrating a positional relationship between an electrode of a light-emitting element 11 and a front electrode 12. FIG. 4 is a view illustrating a pattern of the front electrode 12 and a through hole 14.

As illustrated in FIG. 2, the light-emitting device 2 includes one substrate 10 and two light-emitting elements 11 mounted on the front surface of the substrate 10. The front surface of the substrate 10 is provided with the front electrode 12, and the front electrode is connected to the electrode of the light-emitting element 11. In addition, the rear surface of the substrate 10 is provided with a rear electrode 13. The substrate 10 is provided with through holes 14 formed to pass through the substrate 10 by cutting the side surface. Side electrodes 15 are provided on the side surfaces of the through holes 14. The front surface of the light-emitting element 11 is provided with a phosphor sheet 16, and the side surface of the light-emitting element 11 is covered with a sealing resin 17.

The substrate 10 is an oblong glass epoxy substrate. The front electrode 12 is provided on the front surface of the substrate 10, the front surface being a surface on which the light-emitting element 11 is mounted. The rear electrode 13 is provided on the rear surface of the substrate 10, the rear surface being opposite to the surface on which the light-emitting element 11 is mounted. The front electrode 12 and the rear electrode 13 are connected to each other via the side electrodes 15 provided on the side surfaces of the through holes 14. The front surface of the substrate 10 is provided with the two light-emitting elements 11, and the electrode of the light-emitting element 11 and the front electrode 12 are connected to each other via a solder member (not illustrated).

As the substrate 10, a substrate, in which a glass base material is impregnated with a silicone resin, a bismaleimide-triazine resin, a fluorine-based resin or the like, can be used, besides the glass epoxy substrate.

The light-emitting element 11 is a blue light-emitting element made of a group III nitride semiconductor. The light-emitting element 11 is of a flip-chip type in which an electrode pattern is formed on one surface thereof and light is emitted from a surface opposite to the surface provided with the electrode pattern. The light-emitting element 11 is oblong in a plan view and has a size of 200 µm at a short side and 1100 µm at a long side, in which a ratio (aspect ratio) of the long side to the short side is 5.5.

The lengths of the long side and the short side of the light-emitting element 11 are not limited to the above description as long as the light-emitting element 11 has an oblong shape in which the aspect ratio thereof is not particularly limited but the aspect ratio is preferably 7.5 or less from the viewpoints of uniformity of light emission and ease of manufacture. More preferably, the aspect ratio may be 4.0 or more and 7.0 or less, and still more preferably 4.8 or more and 6.0 or less.

Figure 5:
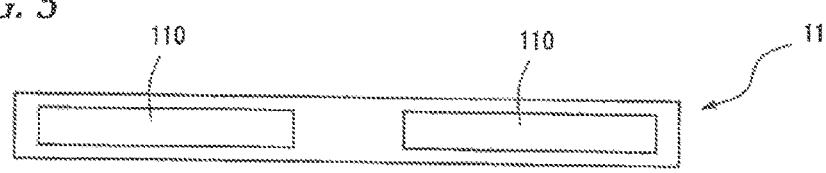
FIG. 5 is a view illustrating a pattern of an electrode of the light-emitting element 11.

As illustrated in FIG. 5, the two electrodes 110 of the light-emitting element 11 have a pattern in which two oblongs are arranged apart from each other, and a longitudinal direction of the substrate 10 and a longitudinal direction of the electrode 110 are aligned. As to the oblong shape of the electrode 110, the short side thereof is 130 µm long, the long side thereof is 415 µm long, and the ratio (aspect ratio) of the long side to the short side is 3.2.

The electrode 110 of the light-emitting element 11 is not necessarily oblong. The electrode 110 may have any shape as long as it is elongated in the longitudinal direction of the light-emitting element 11. The electrode 110 serving as an anode and the electrode 110 serving as a cathode may have different shapes so as to be distinguished from each other. For example, the oblong shapes of the two electrodes 110 may have different lengths in the longitudinal direction, or may have rounded corners. From the viewpoint of a constraint related to the shape of the light-emitting element 11 and for the purpose of ease of manufacture, the aspect ratio is preferably 6.5 or less. More desirably, the aspect ratio may be 2.4 or more and 4.0 or less, and still more desirably it may be 3.0 or more and 3.6 or less. In addition, the length of the electrode 110 in the longitudinal direction is desirably ¼ or less of the length of the long side of the light-emitting element 11. In this case, it is possible to prevent a positional misalignment at the time of mounting the light-emitting element 11.

The two light-emitting elements 11 are arranged in a row on the substrate 10 in the longitudinal direction of the substrate 10. In addition, the two light-emitting elements 11 are arranged such that the longitudinal direction of the light-emitting element 11 and the longitudinal direction of the substrate 10 are aligned. In this state, the electrode 110 of the light-emitting element 11 and the front electrode 12 on the front surface of the substrate 10 are connected to each other via a solder member. In addition, the two light-emitting elements 11 are connected in series via the front electrode 12.

The phosphor sheet 16 is pasted on the upper surface (light emission surface) of the light-emitting element 11. The phosphor sheet 16 is an oblong sheet having the same shape as the light-emitting element 11, and is a resin sheet in which a green phosphor and a red phosphor are mixed with a resin. Due to the presence of the phosphor sheet 16, part of the blue light emitted from the light-emitting element 11 is converted into green light and red light, and the green light and red light are converted into white light by being mixed with blue light.

The side surfaces of the light-emitting element 11 and the phosphor sheet 16 are covered with the sealing resin 17. The light-emitting element 11 is physically and chemically protected by the sealing resin 17. In addition, the light emitted from the light-emitting element 11 is reflected and efficiently mixed. The sealing resin 17 is a silicone resin. Aside from the silicone resin, an epoxy resin, an acrylic resin or the like can be used for the sealing resin 17. Alternatively, an inorganic material such as glass can be used. In addition, a diffusing agent for diffusing light by reflecting the light may be added to the sealing resin 17. The diffusing agent is a particle of $TiO_2$, $SiO_2$ or the like.

The front electrode 12 is provided on the front surface of the substrate 10. As illustrated in FIGS. 1 to 4, the front electrode 12 is composed of patterns 120 and 121 connected to an external device via the rear electrode 13 and a pattern 123 connecting the light-emitting elements 11 in series with each other. The patterns 120 and 121 are disposed at both end portions of the substrate 10, respectively, and the pattern 122 used for connecting the light-emitting elements in series with each other is arranged at the center of the substrate 10.

The patterns 120 and 121 are patterns that are line symmetrical with respect to a straight line that passes the center of the substrate 10 and extends in parallel with the short side direction of the substrate 10. The patterns 120 and 121 are identical when they are inverted left and right. Therefore, only the pattern 120 will be described in detail below, and the description of the pattern 121 will be omitted.

As illustrated in FIG. 3, the pattern 120 includes a first region 120A, a second region 120B connected to the first region 120A, and a third region 120C connected to the first region 120A and the second region 120B.

The first region 120A is a region connected to the electrode 110 of the light-emitting element 11 via a solder member. The first region 120A has an oblong shape in which the length of the short side thereof is identical to that of the electrode 110 of the light-emitting element 11 and the length of the long side thereof is longer than that of the electrode 110, and the longitudinal direction of the oblong shape of the first region 120A is aligned with the longitudinal direction of the substrate 10. Here, the length of the short side of the first region 120A is not necessarily identical to that of the electrode 110. That is, an error of about 10% between the lengths of the short sides of the first region 120A and the electrode 110 is allowable when the manufacturing error is considered. In addition, the length of the long side of the first region 120A may be equal to or longer than that of the electrode 110, or the length of the first region 120A in the long side direction may be identical to that of the electrode 110. However, to arrange the light-emitting element 11 to be as close as possible to the short side of the substrate 10, the length of the long side of the first region 120A is preferably 1.5 times or less the length of the long side of the electrode 110. It is more preferably 1.25 times or less, and still more preferably 1.1 times or less.

The second region 120B is a region connected to the rear electrode 13 via the side electrode 15. The second region 120B is formed in a lid shape covering an upper portion of the through hole 14. The second region 120B has a trapezoid shape as illustrated in FIGS. 3 and 4. Among the two parallel sides of the trapezoid, one side is on the same straight line as the long side of the substrate 10, and the other side is connected to the long side (i.e., side near the through hole) of the first region 120A. Also, among two base angles on the lower base edge of the trapezoid, a base angle near the short side of the substrate 10 is 90°, and the other base angle near the center of the substrate 10 is 45°. Although the base angle of the second region, which is near the short side of the substrate 10, is not required to be 90°, it is desirably set to 90° so that the lateral side of the trapezoid is in parallel with the short side of the substrate 10. With this setting, the light-emitting element 11 can be brought closer to the short side of the substrate 10 when the light-emitting element 11 is mounted, and a positional misalignment of the light-emitting element 11 with respect to a mounting position can be further prevented. Particularly, because the length of the region in a longitudinal direction where first region 120A and the second region 120B are connected to each other is short, it is possible to prevent a position misalignment, i.e. an event in which the light-emitting element 11 rotates toward the short side. In addition, although the base angle of the second region, at the center side of the substrate 10, is not required to be 45°, it is desirably set to 70° or less to obtain sufficient mounting strength when the light-emitting device is mounted on the mounting substrate. More desirably, the base angle may be set to 60° or less. It is preferably set to 30° or more from the viewpoint of process accuracy in pattern formation of the second region 120B.

Since the second region 120B has such a shape that the width in the long side direction thereof increases toward the long side of the substrate 10 near the through hole 14, effects described below can be obtained.

First, it is possible to reduce the length of the side where the first region 120A and the second region 120B are connected to each other. Therefore, of the long side of the first region 120A, which is disposed near the through hole 14A, the length L2 of a portion of the long side, which is defined as the outer periphery of the pattern 120 and is not in contact with the second region 120B, is increased, and the length L2 may be almost the same as the length of the long side of the electrode of the light-emitting element 11. Therefore, an area in which the shape of an end portion (disposed on a side opposite to the short side of the substrate 10) of the first region 120A matches the shape of an end portion of the electrode 110 of the light-emitting element 11, is increased. Thus, the end portions can be easily aligned with each other. For this reason, it is easy to align the electrode 110 of the light-emitting element 11 with the first region 120A, thereby preventing the positional misalignment at the time of mounting the light-emitting element 11.

Second, since the width of the second region 120B on the long side of the substrate 10 is increased, it is possible to secure a wider bonding area when the light-emitting device according to the embodiment is mounted on the mounting substrate. As a result, sufficient mounting strength can be secured.

Third, since the second region 120B is provided to cover the through hole 14A like a lid and the length of the side where the first region 120A and the second region 120B are connected to each other is reduced, it is possible to form the through hole 14A at a position near the short side of the substrate 10.

Figure 6:
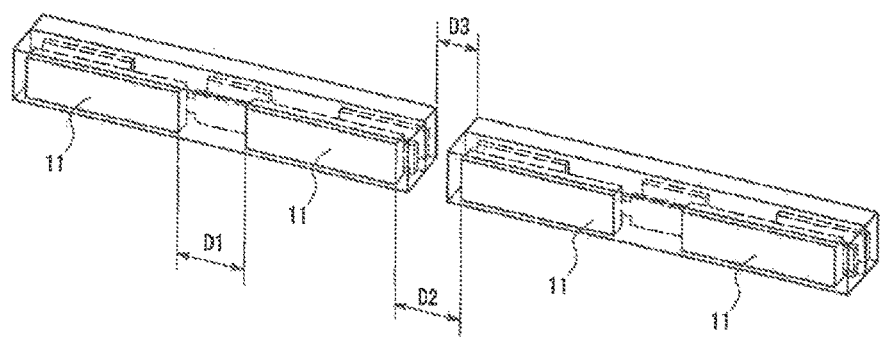
FIG. 6 is a view illustrating a state in which a plurality of the light-emitting devices 2 are mounted on a mounting substrate.

These effects are advantageous in the case in which a plurality of light-emitting devices of the embodiment are mounted in a row on a mounting substrate so as to function as a linear light source and to be used as a light source for a backlight of a liquid crystal display or the like. In a liquid crystal display, a linear light source is required to have high luminance and to reduce luminance unevenness. To this end, as illustrated in FIG. 6, an interval D1 between adjacent light-emitting elements 11 in the light-emitting device and an interval D2 between light-emitting elements 11 disposed in respective light-emitting devices adjacent to each other are equal to each other, and the intervals D1 and D2 preferably have a small value. In the current technology, since it is possible to sufficiently reduce the interval D1, it is required to reduce the interval D2. However, in a side-view type light-emitting device in the related art, when a light-emitting device is mounted, a solder member protrudes from the light-emitting device in the longitudinal direction thereof. Therefore, it was difficult to reduce an interval D3 between adjacent light-emitting devices (i.e. interval between short sides of the substrates 10 of the adjacent light-emitting devices).

Meanwhile, in the light-emitting device according to the embodiment, the through hole 14A is formed by cutting only the long side of the substrate 10. Therefore, when the light-emitting device is mounted, a solder member does not protrude from the through hole 14A, thereby not spreading over and protruding from the side surface of the long side of the substrate 10. Therefore, the interval D3 between the light-emitting devices can be reduced as well as the interval D2. Furthermore, since it is easy to match the end portion of the first region 120A opposite to the short side of the substrate 10 with the end portion of the electrode 110 of the light-emitting element 11, it is possible to prevent a positional misalignment in the direction in which the light-emitting elements 11 approach each other. As a result, it is possible to prevent variations in the intervals D1 and D2 when the intervals D1 and D2 are set to be equal to each other.

A third region 120C is provided at a position opposite to the second region 120B with the first region 120A interposed therebetween, and is connected to the first region 120A. The third region 120C has an oblong shape. The third region 120C is provided to prevent the light-emitting element 11 from rotating to be misaligned when the light-emitting element 11 is mounted on the front surface of the substrate 10.

The reason why the position misalignment is prevented by the third area 120C will be described in more detail. When the light-emitting element 11 is mounted on the substrate 10, a solder member is formed on the first region 120A, the electrode 110 of the light-emitting element 11 is aligned with the first region 120A so as to overlap each other, and heat treatment is performed to melt the solder member. Thus, the electrode 110 of the light-emitting element 11 is bonded to the first region 120A. Then, the molten solder flows from the first region 120A to the second region 120B. Due to the flow of the molten solder, a force of rotating the light-emitting element 11 toward the second region 120B is exerted on the light-emitting element 11, and as a result, the position of the light-emitting element 11 (in particular, the position in the short side direction of the substrate 10) is shifted. Here, when the third region 120C is present, the molten solder flows not only to the second region 120B but also to the third region 120C from the first region 120A. Therefore, a force is applied to the light-emitting element 11 to rotate toward the third region 120C. This force is opposite to the force of rotating the light-emitting element 11 toward the second region 120B. As a result, the force of rotating the light-emitting element 11 is eliminated, or weakened even if it is not eliminated, and thus the positional misalignment at the time of mounting the light-emitting element 11 is prevented.

It should be noted that the shape and size of the third region 120C may be arbitrary and even the third region 120 may not be necessarily provided. However, the third region 120C is preferably provided to prevent the positional misalignment as described above. As to the long sides of the first region 120A on the side opposite to the through hole 14, the length L1 of the long side which is defined as the outer periphery of the pattern 120 and is not in contact with the third region 120C is preferably set to be equal to the long side of the electrode 110 of the light-emitting element 11. Therefore, it is preferable that the shape and size of the third region 120C be set to satisfy this condition. With this setting, the positional misalignment of the light-emitting element 11 can be further prevented.

Next, the pattern 122 of the front electrode 12 will be described. The pattern 122 of the front electrode 12 is an electrode pattern for connecting the two light-emitting elements 11 in series with each other. As illustrated in FIG. 4, the shape of the pattern 122 is composed of a rectangular pattern and oblong patterns connected to the left and right sides of the rectangular pattern. The length of this oblong pattern is longer than the long side of the oblong electrode 110 of the light-emitting element 11. The oblong pattern and the electrode 110 of the light-emitting element 11 (the electrode different from the one connected to the first region 120A) are connected by a solder member. The rectangular pattern is a lid-like pattern covering the upper portion of the through hole 14C.

The rear electrode 13 is provided on the rear surface of the substrate 10. The rear electrode 13 has patterns 130, 131, and 132 connected to the mounting substrate 1 as illustrated in FIG. 1. The patterns 130 and 131 are respectively connected to the patterns 120 and 121 of the front electrode 12 via the side electrode 15. Further, the pattern 132 is connected to the pattern 122 of the front electrode 12 via the side electrode 15.

Each of the patterns 130 and 131 of the rear electrode 13 includes a rectangular pattern provided at an end portion of the substrate 10 and an oblong pattern extending from the rectangular pattern toward the center of the substrate 10. This oblong pattern is provided to improve the heat dissipation property. One side of the rectangular pattern is on the same straight line as the long side of the substrate 10, and the other side is parallel to the short side and the long side of the substrate 10 and is spaced from the substrate 10. Each side of the oblong pattern is spaced from and is in parallel with the short side and the long side of the substrate 10. By providing intervals to the sides of the rectangular pattern or the oblong pattern, when mounting the light-emitting device of the embodiment on the mounting substrate, the solder member 21 is not spread out to protrude. Further, a connection portion between the rectangular pattern and the oblong pattern is provided with a constricted portion. This constricted portion prevents the solder member 21 from flowing in the longitudinal direction of the light-emitting device. For this reason, it becomes easy to form the wall-like solver member 21 on the rear surface of the light-emitting device, thereby improving the mounting strength.

The length of the long side of the oblong pattern may be changed. This enables an anode and a cathode to be distinguished from each other. Also, among the shapes of the patterns 130 and 131 of the rear electrode 13, the rectangular pattern may be any other shape. However, to increase an area to improve the heat dissipation property, the rectangular pattern of the embodiment is preferably used.

The through hole 14 is a hole passing through the substrate 10 from the front surface to the rear surface. The through holes 14 are provided at both end portions and the center of the substrate 10, respectively. The through holes 14A and 14B provided at the end portions of the substrate 10 are formed by cutting the long side of the substrate 10 in the shape of a trapezoidal pattern. The through hole 14C provided at the center of the substrate 10 is formed by cutting the long side of the substrate 10 in the shape of an oblong pattern with rounded corners.

As illustrated in FIG. 4, the trapezoidal pattern of the through holes 14A and 14B has a similar figure that is similar in shape but smaller in size than that of the second region 120B of the front electrode 12. The trapezoidal pattern may not be necessary to have such a reduced similar figure. It may have an arbitrary shape. However, by adopting the reduced similar figure, the distance from the side surface of the through hole 14 to the outer periphery of the second region 120B of the front electrode 12 can be reduced, and the mounting strength of the light-emitting device of the embodiment can be improved when the light-emitting device of the embodiment is mounted on the mounting substrate.

The side surface of the through hole 14 is not necessarily perpendicular to the main surface of the substrate 10 but may be inclined.

The side electrode 15 is provided in a film shape on the side surface of the through hole 14. On the front surface of the substrate 10, the side electrode is connected to the front electrode 12 which covers the through hole 14 like a lid. Further, on the rear surface of the substrate 10, it is connected to the rear electrode 13. In this manner, the front electrode 12 and the rear electrode 13 are connected to each other via the side electrode 15.

As described above, in the light-emitting device 2, it is possible to prevent positional misalignment when the light-emitting element 11 is mounted. In particular, it is possible to prevent misalignment in the short side direction. Further, it is possible to sufficiently secure the mounting strength when the light-emitting device 2 is mounted on the mounting substrate. In the light-emitting device 2, the light-emitting element 11 can be brought close to the short side of the substrate 10.

(Configuration of Mounting Substrate 1)

Figure 7:
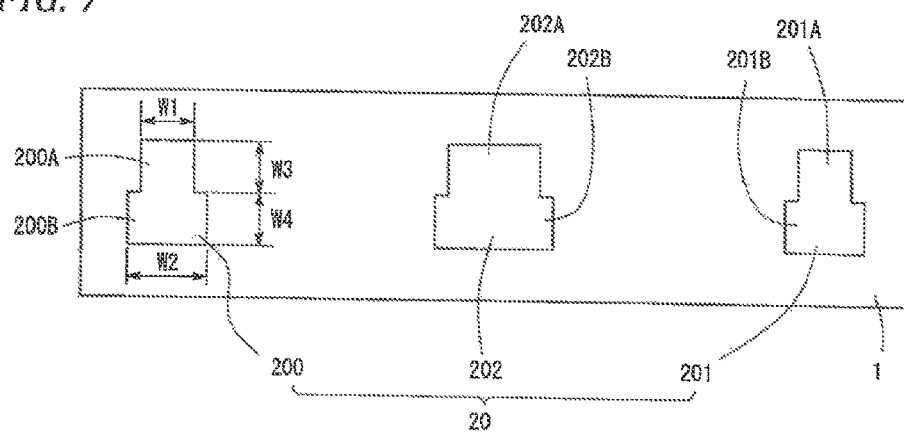
FIG. 7 is a view illustrating a land pattern on a mounting substrate 1.

Next, the configuration of the mounting substrate 1 will be described. The mounting substrate 1 is a substrate on which the light-emitting device 2 is mounted. For example, the mounting substrate 1 is an FPC board. A conductor pattern is formed on the front surface of the mounting substrate 1. FIG. 7 is a diagram illustrating only a land pattern 20 of the conductor pattern. This land pattern 20 is a region connected to the light-emitting device 2 by the solder member 21.

As illustrated in FIG. 7, the land pattern 20 is composed of three separated patterns 200 to 202. The patterns 200 to 202 are arranged corresponding to the through holes 14A to 14C, respectively. The pattern 200 is a region connected to the pattern 130 of the rear electrode 13 and the side electrode 15 on the side surface of the through hole 14A. The pattern 201 is a region connected to the pattern 131 of the rear electrode 13 and the side electrode 15 on the side surface of the through hole 14B. The pattern 202 is a region connected to the pattern 132 of the rear electrode 13 and to the side electrode 15 on the side surface of the through hole 14C.

As illustrated in FIG. 7, the patterns 200 to 202 have an inverted "T" shape. The patterns 200 to 202 include respective narrow regions 200A to 202A which are rectangular and have narrow widths in the long side direction and respective wide regions 200B to 202B which are also rectangular and have wide widths in the long side direction.

The width W1 of the narrow regions 200A to 202A in the long side direction is equal to the width of the through hole 14 in the long side direction. The width W3 of the narrow regions 200A to 202A in the short side direction is equal to the thickness of the substrate 10 (the depth of the through hole 14). Therefore, the shape of the narrow regions 200A to 202A is identical to the cross sectional shape of the through hole 14 in the long side direction. The width W1 is not necessarily identical to the width W3, and there can be an error of about 10% with respect to the through hole 14.

The width W2 of the wide regions 200B to 202B in the long side direction is larger than the width W1. By providing the regions 200B to 202B having the width W2 that is larger than the width W1, when the light-emitting device 2 is connected to the mounting substrate 1 through the solder member 21, the solder member 21 can be formed in a wall shape to be in contact with the rear electrode 13, thereby improving the mounting strength of the light-emitting device 2.

To sufficiently improve the mounting strength, it is desirable that the width W2 be 30% or more, which is larger than the width W1. More desirably, the width W2 is 50% or more, which is larger than the width W1, and far more desirably 100% or more, which is larger. However, if the width W2 is excessively large, a Manhattan phenomenon may occur. Therefore, the width W2 is desirably 150% or less, which is larger than the width W1.

From the viewpoint of improving the mounting strength, it is preferable that the width W4 of the wide regions 200B to 202B in the short side direction be larger than the width W3 by 50% or more. More desirably the width W4 is larger than the width W3 by 80% or more, and far more desirably the width W4 is larger than the width W3 by 100% or more. However, from the viewpoint of prevention of the Manhattan phenomenon, it is desirable that the width W4 of the wide regions 200B to 202B in the short side direction be set to 200% or less larger than the width W3.

Figure 8A:
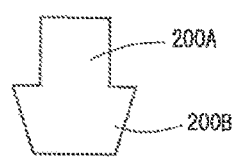
FIGS. 8A and 8B are views illustrating modifications of shapes of wide regions 200B to 202B.
Figure 8B:

In addition, the width W2 of the wide regions 200B to 202B in the long side direction may not be uniform. It is sufficient that the width W2 of the wide regions 200B to 202B in the long side direction is larger than the width W1 at a position at which the wide regions 200B to 202B are respectively in contact with the narrow regions 200A to 202A. For example, the patterns 200 to 202 may have a trapezoid shape in which the width W2 decreases with distance from the narrow regions 200A to 202A as illustrated in FIG. 8A, or a trapezoid shape in which the width W2 increases with the distance from the narrow regions 200A to 202A as illustrated in FIG. 8B.

The light-emitting device 2 is arranged such that the cross-sectional shapes of the through holes 14A to 14C in the long side direction are aligned with the shapes of the narrow regions 200A to 202A in a plan view and is connected via the solder members 21. Specifically, the solder members 21 are formed in a wall shape on the mounting substrate 1 and are in contact with the patterns 200 to 202 of the rear electrode 13, respectively. The solder members 21 are also formed on mounting substrate 1 in the through holes 14. As a result, the solder members 21 connect the patterns 200 to 202 of the rear electrode 13 to the wide regions 200B to 202B, respectively, and connect the side electrodes 15 of the through holes 14A to 14C to the narrow regions 200A to 202A, respectively.

(Mounting Method of Light-Emitting Device 2)

Next, a mounting method of the light-emitting device 2 will be described. First, the solder members 21 are formed on the land patterns 20 of the mounting substrate 1. Next, the light-emitting device 2 is arranged on the mounting substrate 1 such that the narrow regions 200A to 202A of the land patterns 20 are aligned with the cross sectional shape of the through holes 14A to 14C in the long side direction, in a plan view. Next, the solder members 21 are melted through heat treatment, and the mounting substrate 1 and the light-emitting device 2 are connected to each other via the solder members 21. The narrow regions 200A to 202A of the land patterns 20 of the mounting substrate 1 are connected to the side electrodes 15 of the through holes 14A to 14C via the solder members 21. The wide regions 200B to 202B of the land patterns 20 are connected to the patterns 200 to 202 of the rear electrode 13 via the solder members 21. In this way, the light-emitting device 2 is mounted on the mounting substrate 1. It should be noted that the light-emitting device 2 may be mounted in a manner of filling the through holes 14A to 14C with a solder member.

According to the above mounting method, since the land patterns 20 are provided with the wide regions 200B to 202B, the molten solder members 21 spread over these regions during mounting, and the solder members 21 in contact with the rear electrode 13 rise up. Therefore, the solder members 21 are formed on the substrate 10 in a wall shape so as to be in contact with the rear electrode 13. Since the light-emitting device 2 is supported by the wall-like solder members 21, the mounting strength of the light-emitting device 2 is improved. Since the solder members 21 are also present in the through holes 14, it is possible to prevent that the center of gravity of the light-emitting device 2 is inclined toward the opposite side (light-emitting side) of the through holes 14, the light-emitting device 2 floats due to the molten solder members 21 at the time of mounting the light-emitting device 2, and thus the light-emitting device 2 is mounted in an inclined state. Further, since the width W1 of the narrow regions 200A to 202A is equal to the width of the through holes 14 in the long side direction, positioning is easy and the mounting accuracy of the light-emitting device 2 is improved.

(Example of Experiment)

The mounting strength of a light-emitting device 2 in a light source according to the embodiment and the mounting strength of a light-emitting device 2 in a light source according to a comparative example are evaluated. The light source of the comparative example is obtained by replacing land patterns 20 in the embodiment with land patterns having no wide regions 200B to 202B, and the other parts of the light source of the comparative example are the same as those of the light source of the embodiment. The mounting strength was evaluated by shear strength. The shear strength was measured according to EIAJ ED-4702 A that is the standard of Japan Electronics and Information Technology Industries Association (JEITA), and the pressure is applied to the short side direction of the light-emitting device 2. The shear strength of the light-emitting device 2 of the comparative example was about 10 N while the shear strength of the light-emitting device 2 of the embodiment was about 15 N, which is 1.5 times higher than the shear strength of the comparative example.

(Modification)

The light-emitting device 2 is not limited to the configuration described in the embodiment, but it may have any construction in which it has an oblong shape and through holes 14 are provided at both ends of a substrate 10 and formed by cutting a long side of the substrate.

In the embodiment, the pattern of the second region 120B of the front electrode 12 is formed in a trapezoidal shape, but the pattern may have an arbitrary shape and may not necessarily have a lid shape. However, as in the embodiment, the pattern may be shaped such that the width of the long side thereof increases as it becomes closer to one long side of the substrate 10 near the through holes 14. In the case in which the width increases, it may increase continuously or stepwise.

In embodiment, a blue light-emitting element made of a group III nitride semiconductor is used as the light-emitting element 11, and white light of the light-emitting device is made by the phosphor sheet 16. However, the present invention is not limited thereto. As a material of the light-emitting element 11, any semiconductor material other than the group III nitride semiconductor can be used, and as a phosphor to be mixed in the phosphor sheet 16, a material having any emission color can be used. In addition, a phosphor sheet 16 for converting an emission color may be provided as necessary.

In addition, the light-emitting device 2 includes two light-emitting elements 11 mounted thereon and connected in series. However, in the present invention, the number of light-emitting elements 11 mounted on the light-emitting device 2 is not limited to two. The present invention is also applicable to the case in which one light-emitting element 11 is mounted or the case in which three or more light-emitting elements 11 are mounted.

As to the light source according to the embodiment, one light-emitting device 2 is mounted on the mounting substrate 1. However, a plurality of light-emitting devices 2 may be mounted on the mounting substrate 1. In that case, as illustrated in FIG. 6, an interval D1 between adjacent light-emitting elements 11 in one light-emitting device 2 and an interval D2 between light-emitting elements 11 in adjacent respective light-emitting devices 2 are equalized, thereby implementing a light source with high luminance and not having luminance unevenness.

The light source of the invention can be used as various kinds of light sources, such as a backlight light source of a liquid crystal display.

What is claimed is:

1. A light source comprising:
   a mounting substrate; and
   a side-view type light-emitting device, mounted on the mounting substrate, the light-emitting device including:
      a substrate having an oblong shape;
      through holes provided at both ends of the substrate and formed to pass through the substrate;
      a front electrode provided on a front surface of the substrate;
      a rear electrode provided on a rear surface of the substrate;
      side electrodes provided on side surfaces of the through holes and connecting the front electrode and the rear electrode to each other; and
      an oblong flip chip type light-emitting element provided on the front surface of the substrate and connected to the front electrode, wherein:
   the through holes are formed by cutting a long side of the substrate;
   land patterns are formed on a front surface of the mounting substrate, in positions corresponding to the through holes, each land pattern having an inverted "T" shape composed of a narrow region and a wide region having a wider width than the narrow region, the narrow region having a shape identical to a cross sectional shape of the through hole in a long side direction of the substrate;
   the light-emitting device is arranged such that the cross sectional shape of the through hole in the long side direction of the substrate is aligned with the shape of the narrow region of the land pattern, in a plan view; and
   solder members are formed in a wall shape on the mounting substrate, are formed in the through holes on the mounting substrate, and connects the rear electrode and the side electrode to the wide region and the narrow region, respectively.

2. The light source according to claim 1, wherein a width of the wide region in a long side direction of the substrate is larger than a width of the narrow region in the long side direction of the substrate by 30% or more.

3. The light source according to claim 1, wherein a width of the wide region in a short side direction of the substrate is larger than a width of the narrow region in the short side direction of the substrate by 50% or more.

4. The light source according to claim 1, wherein the rear electrode has a rectangular pattern connected to the side electrode and an oblong pattern extending from the rectangular pattern in the long side direction of the substrate and has a constricted portion in a connection portion by which the rectangular pattern and the oblong pattern are connected to each other, the constricted portion being arranged near the through hole.

5. The light source according to claim 1, wherein a plurality of the light-emitting devices are arranged at intervals on the mounting substrate, and an interval between the light-emitting elements in one light-emitting device of the light-emitting devices is set to be equal to an interval between the light-emitting elements in the respective light-emitting devices adjacent to each other.

6. A method of mounting a side-view type light-emitting device on a mounting substrate, the light-emitting device including: a substrate having an oblong shape; through holes provided at both ends of the substrate and formed to pass through the substrate; a front electrode provided on a front surface of the substrate; a rear electrode provided on a rear surface of the substrate; side electrodes provided on side surfaces of the through holes and connecting the front electrode and the rear electrode to each other; and an oblong flip chip type light-emitting element provided on the front surface of the substrate and connected to the front electrode, in which the through holes being formed by cutting long sides of the substrate, the method comprising:
   forming a land pattern on a front surface of the mounting substrate, in a position corresponding to the through hole, the land pattern having an inverted "T" shape composed of a narrow region and a wide region having a wider width than the narrow region, the narrow region having a shape identical to a cross sectional shape of the through hole in a long side direction of the substrate;
   forming a solder member on the land pattern;
   arranging the light-emitting device such that the cross sectional shape of the through hole in the long side direction of the substrate is aligned with the shape of the narrow region of the land pattern, in a plan view; and
   melting the solder member through heat treatment such that the solder member is formed in a wall shape on the mounting substrate and is formed in the through hole on the mounting substrate, thereby connecting the rear electrode and the side electrode to the wide region and the narrow region, respectively.

* * * * *